United States Patent
Choi et al.

(10) Patent No.: US 9,799,813 B2
(45) Date of Patent: Oct. 24, 2017

(54) LEAD FRAME AND SEMICONDUCTOR PACKAGE INCLUDING THE LEAD FRAME

(71) Applicant: SAMSUNG ELECTRONICS CO., LTD., Suwon-si, Gyeonggi-do (KR)

(72) Inventors: Seung Hwan Choi, Suwon-si (KR); Ho Young Song, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/400,217

(22) Filed: Jan. 6, 2017

(65) Prior Publication Data

US 2017/0244012 A1 Aug. 24, 2017

(30) Foreign Application Priority Data

Feb. 18, 2016 (KR) .................. 10-2016-0018969

(51) Int. Cl.
  *H01L 21/78* (2006.01)
  *H01L 33/62* (2010.01)
  *H01L 33/56* (2010.01)
  *H01L 33/60* (2010.01)

(52) U.S. Cl.
  CPC ............. *H01L 33/62* (2013.01); *H01L 33/56* (2013.01); *H01L 33/60* (2013.01); *H01L 2933/005* (2013.01); *H01L 2933/0058* (2013.01); *H01L 2933/0066* (2013.01)

(58) Field of Classification Search
  CPC ........................................... H01L 2224/48247
  See application file for complete search history.

(56) References Cited

U.S. PATENT DOCUMENTS

| | | | |
|---|---|---|---|
| 6,677,522 B1 | 1/2004 | Carey et al. | |
| 7,399,658 B2 | 7/2008 | Shim et al. | |
| 7,452,219 B2 | 11/2008 | Kitajima et al. | |
| 7,696,001 B2 | 4/2010 | Nuechter et al. | |
| 7,723,830 B2 | 5/2010 | Hauenstein | |
| 8,752,754 B2 | 6/2014 | Shoji et al. | |
| 9,013,878 B2 | 4/2015 | Dimauro et al. | |
| 2005/0087883 A1 | 4/2005 | Hwee et al. | |
| 2012/0267798 A1* | 10/2012 | Haba | H01L 23/3128 257/777 |
| 2013/0127062 A1* | 5/2013 | Haba | H01L 23/492 257/773 |
| 2013/0168843 A1* | 7/2013 | Zohni | H01L 23/433 257/706 |
| 2014/0220744 A1* | 8/2014 | Damberg | H01L 25/105 438/127 |
| 2016/0336232 A1* | 11/2016 | Hsieh | H01L 25/072 |

FOREIGN PATENT DOCUMENTS

JP 2006-287234 A 10/2006
KR 2012-0099779 A 9/2012

* cited by examiner

*Primary Examiner* — Thao P Le
(74) *Attorney, Agent, or Firm* — Lee & Morse, P.C.

(57) ABSTRACT

A lead frame includes a bonding part to bond to a semiconductor chip, a first trench in the bonding part along a first central axis, the first central axis dividing the bonding part into two parts, and second trenches in the bonding part along a second central axis, the second central axis dividing the bonding part into two parts, and the first and second central axes vertically intersecting each other.

20 Claims, 10 Drawing Sheets

US 9,799,813 B2

LEAD FRAME AND SEMICONDUCTOR PACKAGE INCLUDING THE LEAD FRAME

CROSS-REFERENCE TO RELATED APPLICATION

Korean Patent Application No. 10-2016-0018969, filed on Feb. 18, 2016, in the Korean Intellectual Property Office, and entitled: "Lead Frame and Semiconductor Package Including the Lead Frame," is incorporated by reference herein in its entirety.

BACKGROUND

1. Field

The present disclosure relates to a lead frame, a semiconductor package including the lead frame, and a method of manufacturing the semiconductor package. More particularly, the present disclosure relates to a lead frame having trenches included in a bonding part, to which a semiconductor chip is bonded, a semiconductor package including the lead frame, and a method of manufacturing the semiconductor package.

2. Description of the Related Art

Wire bonding has been widely used to connect a semiconductor chip and a substrate of a semiconductor package, but during a semiconductor packaging process, the integration density of wiring increases due to an increase in the number of input/output pads. As the integration density of wiring increases, the semiconductor packaging process becomes more difficult. To address this problem, flip-chip bonding has been suggested, in which solder bumps are formed on the, e.g., entire, surface of the semiconductor chip so as to directly connect the semiconductor chip to the substrate.

SUMMARY

According to an exemplary embodiment of the present disclosure, a lead frame includes a bonding part to which a semiconductor chip is bonded, a first trench formed in the bonding part to extend along a first central axis, which divides the bonding part into two parts and second trenches formed in the bonding part to extend along a second central axis, which divides the bonding part into two parts, wherein the first and second central axes vertically intersect each other.

According to another exemplary embodiment of the present disclosure, a semiconductor package includes a lead frame; and a semiconductor chip bonded to the lead frame, wherein the lead frame includes a bonding part to which the semiconductor chip is bonded, a first trench formed in the bonding part to extend along a first central axis, which divides the bonding part into two parts, and second trenches formed in the bonding part to extend along a second central axis, which divides the bonding part into two parts, wherein the first and second central axes vertically intersect each other.

According to yet another exemplary embodiment of the present disclosure, a lead frame may include a bonding part to support a semiconductor chip, a first trench in the bonding part along a first central axis of the bonding part, the first central axis dividing the bonding part into two parts, the first trench being filled with a material different from a material of the lead frame, and second trenches in the bonding part along a second central axis, the second central axis dividing the bonding part into two parts, and the first and second central axes being perpendicular to each other.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
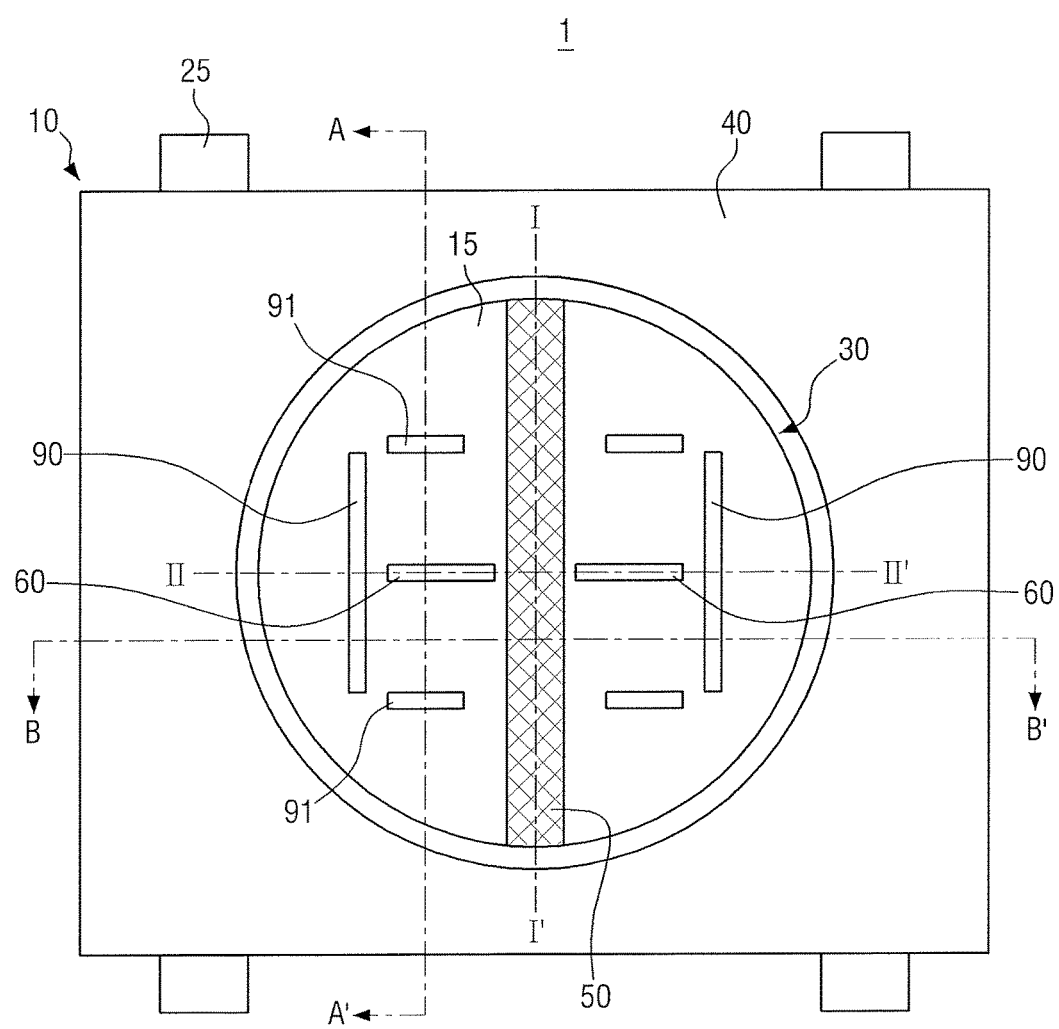
FIG. 1 illustrates a top view of a semiconductor package according to an exemplary embodiment of the present disclosure.
Figure 2A:
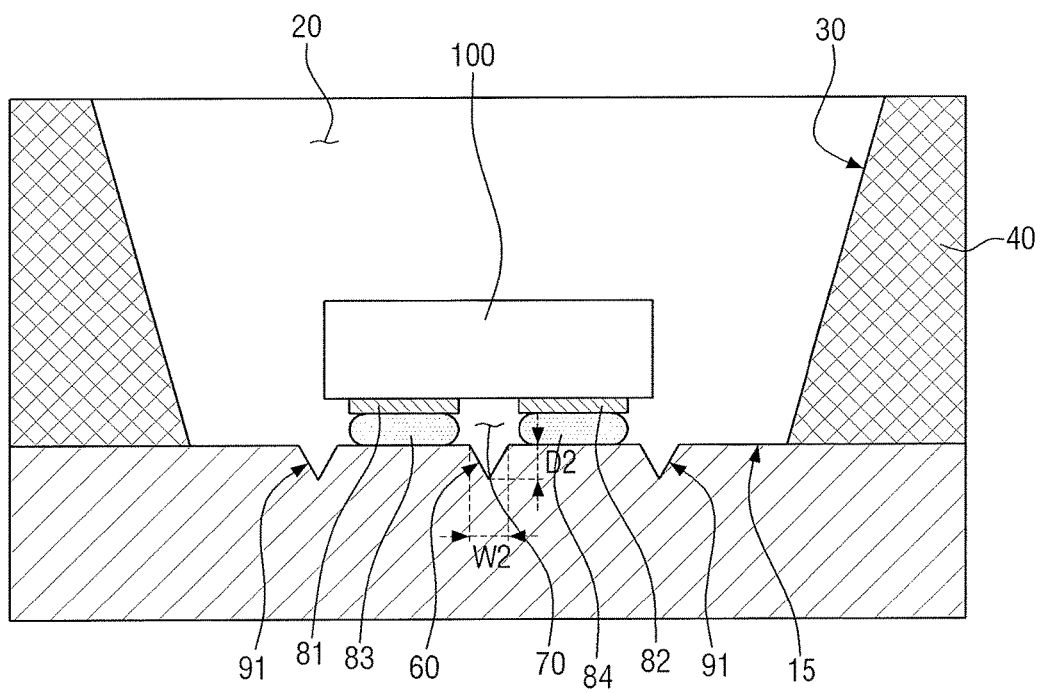
FIG. 2A illustrates a cross-sectional view taken along line A-A' of FIG. 1.
Figure 2B:
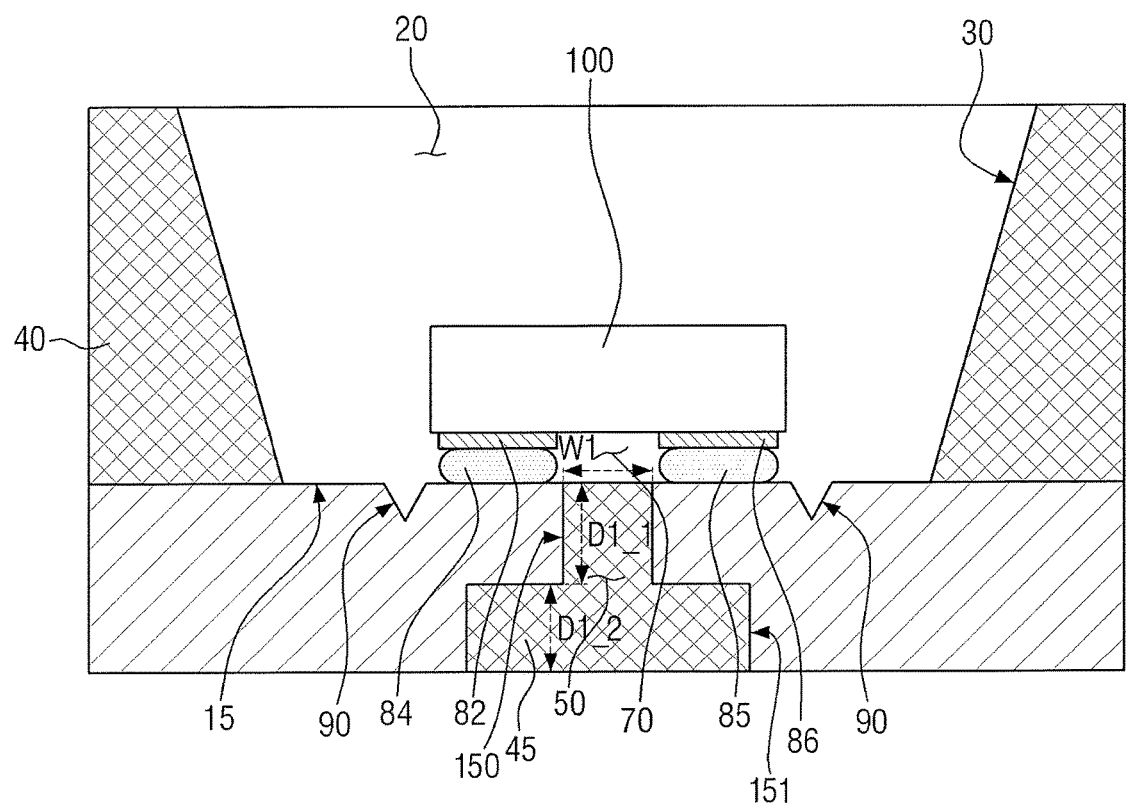
FIG. 2B illustrates a cross-sectional view taken along line B-B' of FIG. 2.

FIG. 1 is a top view of a semiconductor package according to an exemplary embodiment of the present disclosure, FIG. 2A is a cross-sectional view taken along line A-A' of FIG. 1, and FIG. 2B is a cross-sectional view taken along line B-B' of FIG. 2. For convenience, a semiconductor chip and solder bumps are not illustrated in FIG. 1.

Referring to FIGS. 1 through 2B, a semiconductor package 1 may include a lead frame 10 and a semiconductor chip 100. The lead frame 10 may include a bonding part 15, a first trench 50, second trenches 60, third trenches 90, fourth trenches 91, a reflector 40, and electrodes 25.

In detail, the bonding part 15 of the lead frame 100 may function as a substrate for arranging the semiconductor chip 100 thereon. For example, as illustrated in FIGS. 2A-2B, the semiconductor chip 100 may be positioned on the bonding part 15. The semiconductor chip 100 may be electrically connected to the lead frame 10, i.e., to the bonding part 15, via first, second, and third solder bumps 83, 84, and 85 that are disposed on the bonding part 15.

The bonding part 15 may include a metal with excellent electrical conductivity. In detail, the bonding part 15 may include a metal, e.g., gold (Au), silver (Ag), or copper (Cu), but the present disclosure is not limited thereto. That is, the bonding part 15 may also include an alloy of at least one of Au, Ag, and Cu and another metal.

The first trench 50, the second trenches 60, the third trenches 90, and the fourth trenches 91 may be formed in the bonding part 15. For example, as illustrated in FIGS. 2A-2B, the second and third trenches 60 and 90 may be formed to a predetermined depth from a top surface of the bonding part 15.

In detail, the first trench 50 may be formed in the bonding part 15 along a first central axis I, which divides the bonding part 15 into two parts. The first trench 50 may be formed to extend from both sides of the first central axis I.

As illustrated in FIG. 2B, the first trench 50 may include a first part 150, which is recessed from the top surface of the bonding part 15 to a first depth D1_1, and a second part 151, which is recessed from the bottom of the first part 150 to a second depth D1_2. The width of the second part 151 may be larger than the width of the first part 150. As illustrated in FIG. 2B, the width of the first part 150 is width W1.

The first trench 50 may be filled with a molding material 45. The molding material 45, which fills the first trench 50, may include a different material from the material that forms the top surface of the bonding part 15. For example, the molding material 45 may include an insulating material, e.g., an epoxy molding compound (EMC), polycyclohexylenedimethylene terephthalate (PCT), or polyphtalamide (PPA), etc., but the present disclosure is not limited thereto.

For example, as illustrated in FIG. 2B, a top surface of the molding material 45 in the first trench 50 may be substantially level, e.g., coplanar, with a top surface of the bonding part 15. Since the first trench 50 is filled with the molding material 45, a second electrode 82 and a third electrode 86 of the semiconductor chip 100, which are on opposite sides of the first trench 50, may be electrically insulated from each other.

The molding material 45, which fills the first trench 50, may be the same as a molding material that fills the reflector 40. The filling of the first trench 50 with the molding material 45 and the formation of the reflector 40 with the same molding material may be performed by the same process, but the present disclosure is not limited thereto.

The second trenches 60 may be formed in the bonding part 15 along a second central axis II, which divides the bonding part 15 into two parts. The second central axis II may perpendicularly intersect the first central axis I.

The second trenches 60 may be formed to be spaced apart from the first trench 50. That is, the second trenches 60 may be disposed on both sides of the first trench 50 at an interval of a predetermined distance along the second central axis II, e.g., two second trenches 60 may be on opposite sides of the first trench 50. The second trenches 60 may be spaced apart from the first trench 50 by the same distance.

As illustrated in FIG. 2A, the sidewalls of each of the second trenches 60 may form a V shape, but the present disclosure is not limited thereto. That is, the second trenches 60 may be formed in any shape that can isolate a first part of the top surface of the lead frame 10 (i.e., where the first solder bump 83 is provided) from a second part of the top surface of the lead frame 10 (i.e., where the second solder bump 84 is provided).

A width W2 of the second trenches 60 may be smaller than the width W1 of the first trench 50, e.g., the width W2 of each of the second trenches 60 may be about 40 μm. A depth D2 of the second trenches 60 may be smaller than a total depth of the first trench 50, i.e., the depth D2 is smaller than a sum of D1_1+D1_2.

The first trench 50 and the second trenches 60 of the semiconductor package 1 may be formed by different processes. For example, the formation of the first trench 50 and the second trenches 60 may involve forming the first trench 50 in the bonding part 15 using a mold having the shape of the first trench 50, and forming the second trenches 60 in the bonding part 15 using a mold having the shape of the second trenches 60. To form the first trench 50 and the second trenches 60, which have a different depth from the first trench 50, the first trench 50 and the second trenches 60 may be sequentially formed. The second trenches 60 may prevent molten solder from the second and third solder bumps 84 and 85 in a reflow process from flowing along the top surface of the bonding part 15, and this will be described later in detail with reference to FIG. 3.

The third trenches 90 may be formed in the bonding part 15. The third trenches 90 may be disposed in parallel to the first trench 50. That is, the third trenches 90 may extend in a direction perpendicular to the direction of the second central axis II, which is the direction in which the second trenches 60 extend. The third trenches 90 may extend in the same direction as the first trench 50, i.e., the direction of the first central axis I. The third trenches 90 may be formed to be spaced apart from the second trenches 60, respectively, in a direction oriented toward an edge, e.g., an outer circumference, of the bonding part 15.

The third trenches 90 may have substantially the same width and depth as the second trenches 60. That is, the third trench 90 may have the width W2 and the depth D2. The third trenches 90 may perform a similar function to the second trenches 60. That is, the third trenches 90 may prevent molten solder from the second and third solder bumps 84 and 85 in a reflow process from flowing toward the outer circumference of the bonding part 15.

The third trenches 90 may be formed by the same process as the second trenches 60. It is assumed that the second trenches 60 are formed in the bonding part 15 using a mold having the shape of the second trenches 60. The mold having the shape of the second trenches 60 may also have the shape of the third trenches 90. Thus, by pressing the bonding part 15, the second trenches 60 and the third trenches 90 may both be formed at the same time.

FIG. 2B illustrates the third trenches 90 as not being overlapped by the semiconductor chip 100, but the present disclosure is not limited thereto. For example, the third trenches 90 may be completely or partially overlapped by the semiconductor chip 100. As illustrated in FIG. 2B, the sidewalls of each of the third trenches 90 may form a V shape, but the present disclosure is not limited thereto. That is, the third trenches 90 may be formed in any shape that can prevent molten solder from the second solder bump 84 in a reflow process from flowing toward the outer circumference of the bonding part 15.

The fourth trenches 91 may be formed in the bonding part 15. The fourth trenches 91 may be disposed in parallel to the second trenches 60. FIG. 2A illustrates the fourth trenches 91 as being partially overlapped by the semiconductor chip 100, but the present disclosure is not limited thereto. For example, the fourth trenches 91 may not be overlapped at all by the semiconductor chip 100 or may be completely overlapped by the semiconductor chip 100.

The fourth trenches 91 may perform a similar function to the third trenches 90. That is, the fourth trenches 91 may prevent molten solder from the second and third solder bumps 84 and 85 in a reflow process from flowing toward the outer circumference of the bonding part 15.

As illustrated in FIG. 2A, the fourth trenches 91, like the third trenches 90, may have substantially the same width and area as the second trenches 60. The fourth trenches 91, like the third trenches 90, may be formed by the same process as the second trenches 60. Thus, the third trenches 90 may have substantially the same width and area as the fourth trenches 91. The third trenches 90 and the fourth trenches 91 may be disposed to surround the semiconductor chip 100.

The reflector 40 may surround, e.g., a portion of, the bonding part 15. The reflector 40 may have sidewalls 30 having a predetermined slope. In a case in which the semiconductor chip 100 is a light-emitting diode (LED) chip, the reflector 40 may reflect light emitted from the semiconductor chip 100 and may thus allow the light to be emitted toward the top surface of the semiconductor package 1.

A cavity 20, which surrounds, e.g., a portion of, the bonding part 15 and the, e.g., entire, semiconductor chip 100, may be formed, e.g., defined, by the sidewalls 30 of the reflector 40. That is, the sidewalls 30 of the reflector 40 may surround the semiconductor chip 100 and the cavity 20. For example, as illustrated in FIGS. 1 and 2A, the reflector 40 may include an opening therethrough (i.e., the cavity 20) defined by the sidewalls 30, so the reflector 40 may be positioned on the bonding part 15 (FIG. 2A) to have the first through fourth trenches exposed through the cavity 20 (FIG. 1).

The cavity 20 may be filled with an encapsulant. The encapsulant may protect the semiconductor chip 100 and may transmit light emitted from the semiconductor chip 100 therethrough so as for the light to be emitted out of the semiconductor package 1, e.g., the encapsulant may be silicon or heat-resistant epoxy.

The semiconductor chip 100 may include a first electrode 81, the second electrode 82, and the third electrode 86, and may be electrically connected to the bonding part 15 and the lead frame 10 via the first, second, and third solder bumps 83, 84, and 85. In some exemplary embodiments, the semiconductor chip 100 may be an LED chip. In a case in which the semiconductor chip 100 is an LED chip, light may be emitted from the semiconductor chip 100, connected to the lead frame 10 through flip-chip bonding, toward the top surface of the semiconductor package 1.

The first and second electrodes 81 and 82 of the semiconductor chip 100 may have the same polarity. For example, the first and second electrodes 81 and 82 may be electrodes supplying a positive voltage. The second and third electrodes 82 and 86 may have different polarities. For example, if the second electrode 82 is an electrode supplying a positive voltage, the third electrode 86 may be an electrode supplying a negative voltage.

The semiconductor chip 100 may be electrically connected to the lead frame 10 through flip-chip bonding. That is, the semiconductor chip 100 may be electrically connected directly to the lead frame 100, using the first, second, and third solder bumps 83, 84, and 85, without a requirement of wire bonding.

The first, second, and third solder bumps 83, 84, and 85 may not be disposed at the tops of the first trench 50 and the second trenches 60, e.g., the solder bumps 83, 84, and 85 may have a non-overlapping relationship with the tops of the first trench 50 and the second trenches 60. The first, second, and third solder bumps 83, 84, and 85 may not be placed in contact with the sidewalls of each of the first trench 50 and the second trenches 60, e.g., the solder bumps 83, 84, and 85 may be spaced apart from sidewalls of each of the first trench 50 and the second trenches 60 to prevent contact therebetween.

The electrodes 25 may be electrically connected to the bonding part 15, and may supply power or signals to the semiconductor chip 100. In a case in which the semiconductor package 1 is mounted on a substrate, e.g., a printed circuit board (PCB), the electrodes 25 may serve as ports for connecting the PCB and the semiconductor package 1.

The space among the first, second, and third solder bumps 83, 84, and 85 may be filled with an underfill material. That is, referring to FIGS. 2A-2B, a space 70 defined by the bottom surface of the semiconductor chip 100, the inner sides of the first, second, and third solder bumps 83, 84, and 85, and the top surface of the bonding part 15 may be filled with the underfill material. For example, the underfill material may include an epoxy resin, but the present disclosure is not limited thereto.

The underfill material may support the first, second, and third solder bumps 83, 84, and 85. That is, the first, second, and third solder bumps 83, 84, and 85 not only electrically connect the semiconductor chip 100 and the bonding part 15, but also support the semiconductor chip 100, and the underfill material may strengthen the support of the semiconductor chip 100 by the first, second, and third solder bumps 83, 84, and 85.

Also, the underfill material may surround the first, second, and third solder bumps 83, 84, and 85, and may thus insulate the first, second, and third solder bumps 83, 84, and 85 from one another. That is, the underfill material, which includes an insulating material, may prevent the first, second, and third solder bumps 83, 84, and 85 from being short-circuited.

The second trenches 60, the third trenches 90, and the fourth trenches 91 may also be filled with the underfill material that fills the space 70.

If a semiconductor package were to include no trenches (e.g., no second trenches 60 of FIG. 2A) in a bonding part thereof, during melting of solder bumps in a reflow process so as to connect the semiconductor chip and the bonding part, the molten solder would have flown over the top surface of the bonding part (as molten solder obtained from a reflow process has properties of a liquid until it is cooled down to a predetermined temperature). In response to the molten solder flowing over the top surface of the bonding part, the position of the semiconductor chip could have changed, or the semiconductor chip could have tilted over the bonding part, e.g., if the molten solder were to irregularly flow and be distributed over the bonding part.

However, if the semiconductor chip is tilted by more than a predetermined angle toward the bonding part, a corner of the semiconductor chip tilted toward the bonding part may be placed in contact with the top surface of the bonding part, thereby causing stress to the semiconductor chip. As the stress applied to the semiconductor chip accumulates, cracks may be formed in the insulating layer(s) in the corner part of the semiconductor chip contacting the bonding part. Thus, the operating reliability of the semiconductor chip may be lowered.

Figure 3:
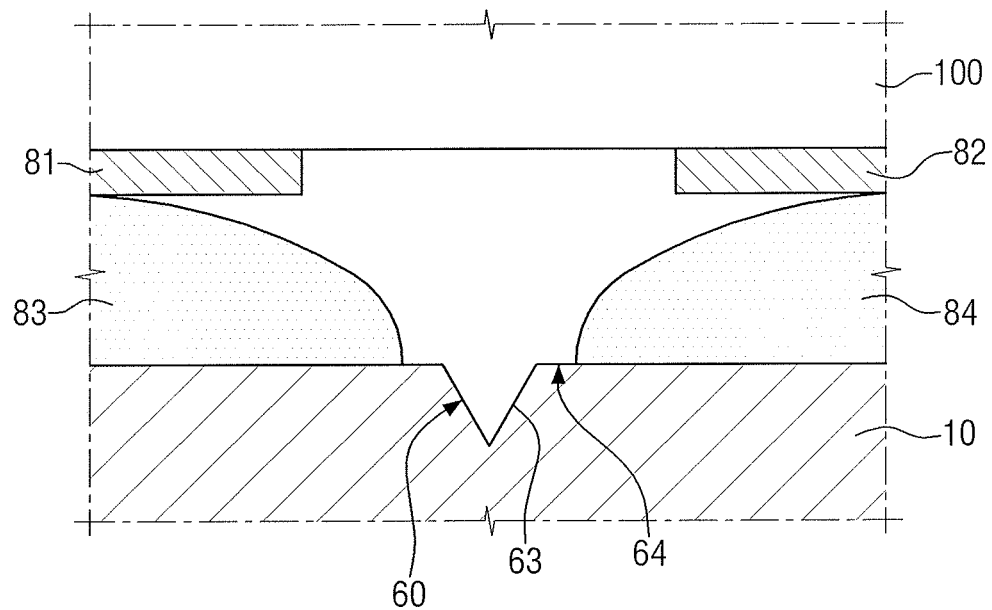
FIG. 3 illustrates an enlarged view of part of the semiconductor package according to the exemplary embodiment of FIG. 1.

In contrast, according to example embodiments, the second trenches 60 are formed between solder bumps, as will be explained in detail with reference to FIG. 3, in order to prevent or substantially minimize flow of molten solder on the top surface of the bonding part 15. FIG. 3 illustrates an enlarged view of the second trench 60 in FIG. 2A according to the exemplary embodiment.

Referring to FIGS. 2A and 3, the second trench 60 is disposed between the first and second solder bumps 83 and 84. Sidewalls 63 of the second trench 60 form a predetermined angle with a top surface 64 of the bonding part 15. Thus, even if the first or second solder bump 83 or 84 is melted during a reflow process, molten solder from the first or second solder bump 83 or 84 may flow in the second trenches 60, and may be prevented from spilling over the second trench 60 due to the surface tension of the first or second solder bump 83 or 84.

For this, the first and second solder bump 83 and 84 may not be disposed at the top of the second trench 60. Also, the first or second solder bump 83 or 84 may not be placed in contact with the sidewalls 63 of the second trench 60. For example, as illustrated in FIG. 3, the first and second solder bump 83 and 84 may be spaced apart from an edge of the second trench 60, i.e., from the sidewall 63 of the second trench 60.

Due to the presence of the second trench 60, the first and second solder bumps 83 and 84 may be isolated from each other. Thus, the semiconductor chip 100 may be prevented from moving or tilting. Also, the second trench 60 may prevent mechanical stress that may be applied to the semiconductor chip 100 in response to the semiconductor chip 100 tilting and being placed in contact with the bonding part 15.

Figure 4:
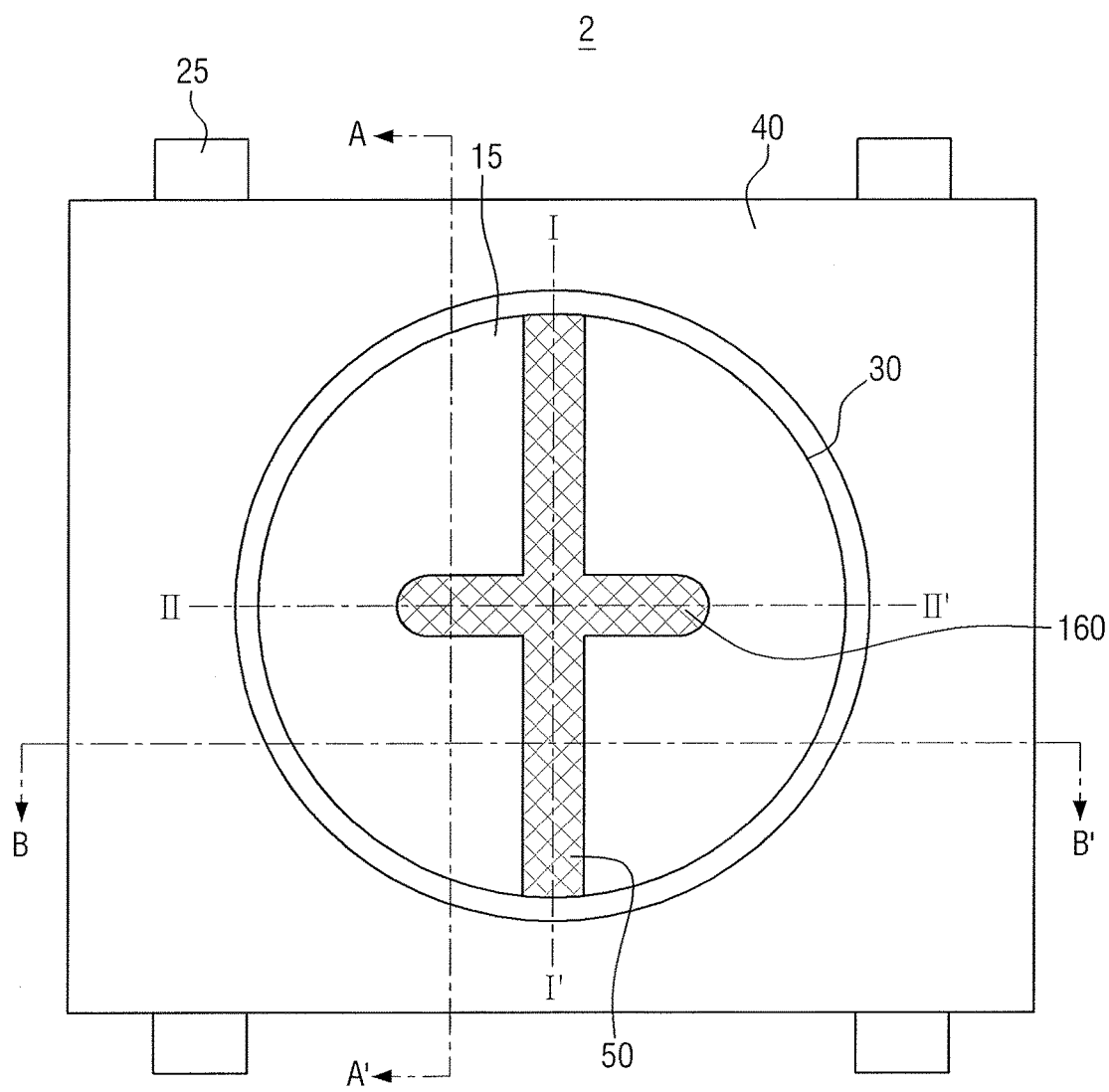
FIG. 4 illustrates a top view of a semiconductor package according to another exemplary embodiment of the present disclosure.
Figure 5:
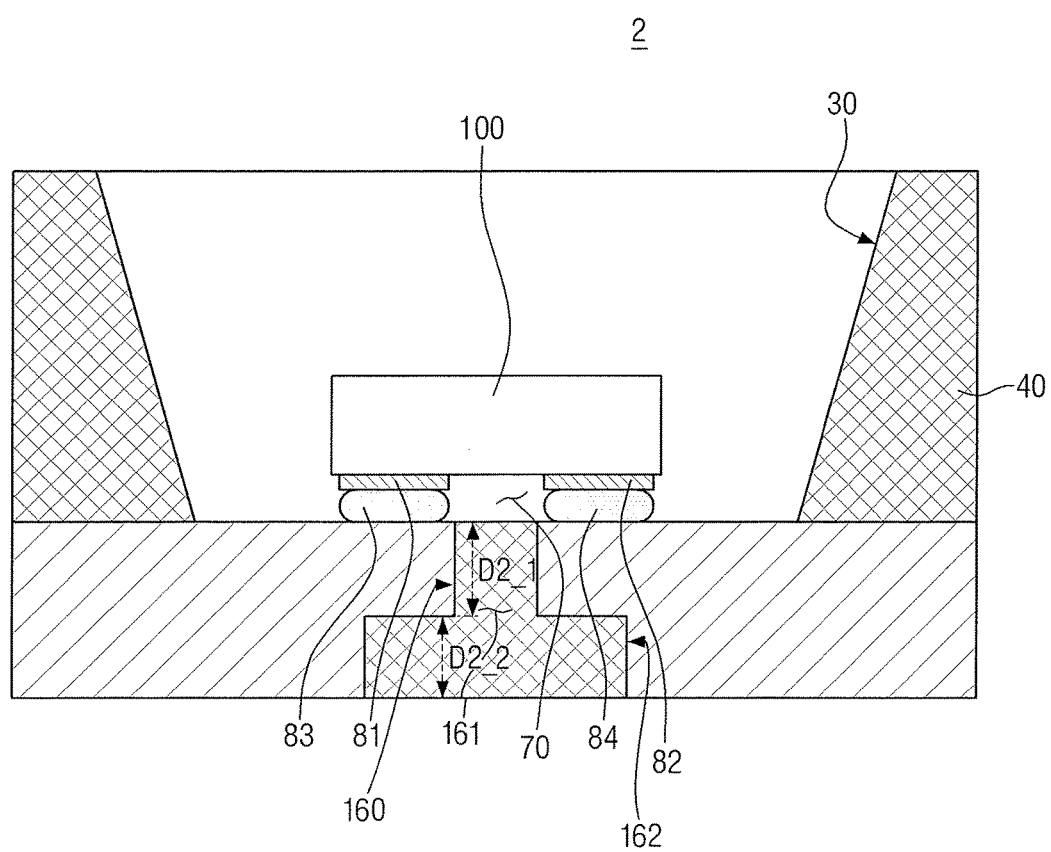
FIG. 5 illustrates a cross-sectional view taken along line A-A' of FIG. 4.
Figure 6:
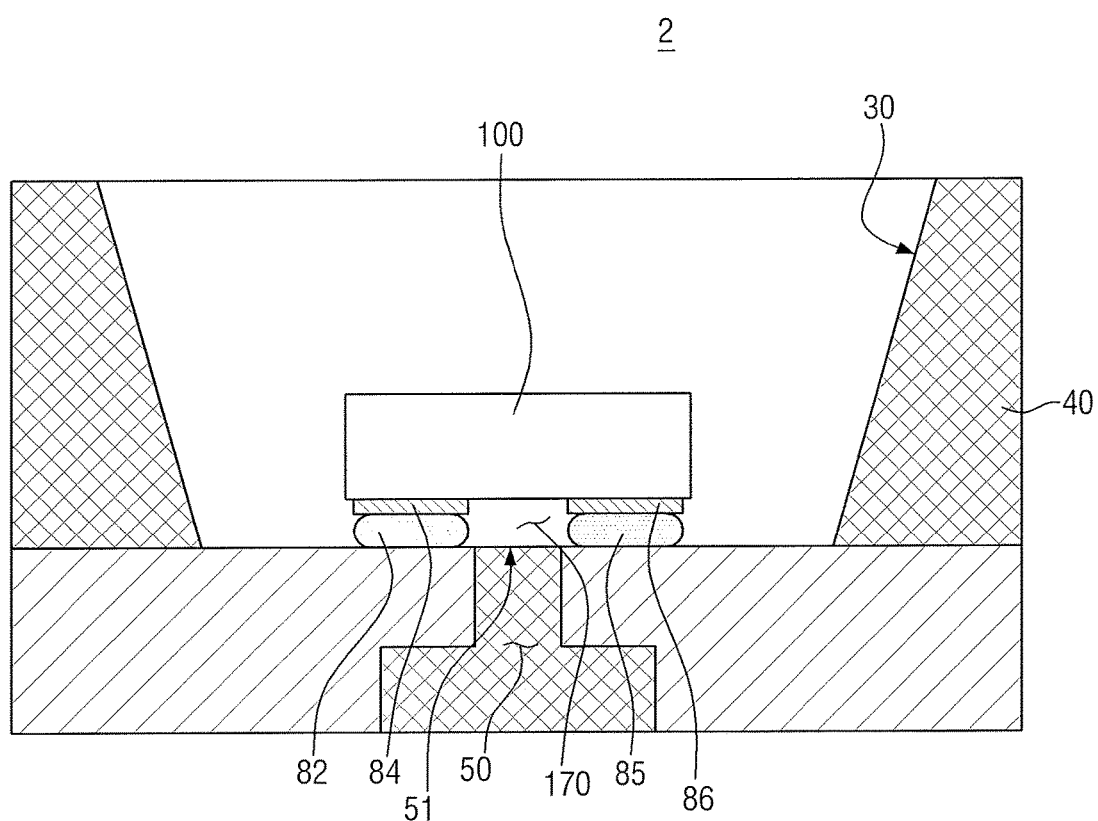
FIG. 6 illustrates a cross-sectional view taken along line B-B' of FIG. 4.

FIG. 4 is a top view of a semiconductor package according to another exemplary embodiment of the present disclosure, FIG. 5 is a cross-sectional view taken along line A-A' of FIG. 4, and FIG. 6 is a cross-sectional view taken along line B-B' of FIG. 4. The exemplary embodiment of FIG. 4 will hereinafter be described, focusing mainly on differences with respect to the exemplary embodiment of FIG. 1.

Referring to FIGS. 4 through 6, a semiconductor package 2 may differ from the semiconductor package 1 in the shape of the second trench thereof. That is, the semiconductor package 2 may include a second trench 160 connected to the first trench 50. The second trench 160 may be formed along the second central axis II and may extend from both sides of the first trench 50.

The second trench 160 may be formed to the same depth as the first trench 50. The second trench 160 may be formed at the same level as the first trench 50. The expression "two elements formed at the same level", as used herein, means that the two elements are formed by the same process.

For example, the first and second trenches 50 and 160 may be formed by etching the lead frame 10. The formation of the first trench 50 through etching may involve etching the top surface and the bottom surface of the bonding part 15 separately. That is, in order to form the first and second parts 150 and 151 with different widths, the top surface and the bottom surface of the bonding part 15 may be etched separately. Similarly, the second trench 160 may be formed by etching the top surface and the bottom surface of the bonding part 15 separately.

The first trench 50 may have a combined depth D1_1+D1_2, which is the sum of the depth D1_1 of the first part 150 and the depth D1_2 of the second part 151. The second trench 160 may have a combined depth D2_1+D2_2, which is the sum of a depth D2_1 of a first part 161 of the second trench 160 and a depth D2_2 of a second part 162 of the second trench. The first and second trenches 50 and 160 may have the same depth. That is, the combined depth D1_1+D1_2 may be the same as the combined depth D2_1+D2_2. The depth D1_1 of the first part 150 of the first trench 50 may be the same as the depth D2_1 of the first part 161 of the second trench 160, and the depth D1_2 of the second part 151 of the first trench 50 may be the same as the depth D2_2 of the second part 162 of the second trench 160.

The first trench 50 may be filled with a molding material. The second trench 160 may also be filled with the molding material. The formation of the first trench 50 and the formation of the second trench 160 may be performed at the same level, e.g., simultaneously by a same process. Similarly, the filling of the first trench 50 with the molding material and the filling of the second trench 160 with the molding material may also be performed at the same level.

The molding material that fills the first and second trenches 50 and 160 may be the same as the molding material that fills the reflector 40. For example, the molding material that fills the first and second trenches 50 and 160 may include PCT, an EMC, or PPA, but the present disclosure is not limited thereto. Since the second trench 160 is filled with the molding material, the top surface of the bonding part 15 includes a different material from the molding material filling the second trench 160.

The second trench 160 has a different shape from the second trenches 60 of FIG. 1, but may perform the same functions as the second trenches 60 of FIG. 1. That is, the second trench 160 may prevent molten solder from first and second solder bump 83 and 84 in a reflow process from flowing along the top surface of the bonding part 15.

In detail, in the exemplary embodiment of FIG. 1, the second trenches 60 may prevent the flow of molten solder from the first and second solder bumps 83 and 84 because of the angle that the sidewalls 63 (FIG. 3) of each of the second trenches 60 form with the top surface of the bonding part 15. In the present embodiment of FIG. 5, the second trench 160 may prevent the flow of molten solder from the first and second solder bumps 83 and 84 because the top of the second trench 160 includes a different material from the top surface of the bonding part 15.

That is, the second trench 160 is filled with an insulating material, e.g., PCT, PPA, or an EMC, whereas the bonding part 15 includes metal, e.g., Ag, Au, Cu, or an alloy thereof. Thus, even if molten solder from the first and second solder bumps 83 and 84 begins to flow during a reflow process, the molten solder may not be able to spill over to the second trench 160 because of the difference between the material of the bonding part 15 and the molding material filling the second trench 160 along the edges of the second trench 160.

The first and second solder bumps 83 and 84 may not be disposed at the top of the second trench 160. Thus, the second trench 160 can prevent the operating reliability of the semiconductor chip 100 from being lowered because of the tilt of the semiconductor chip 100.

Figure 7:
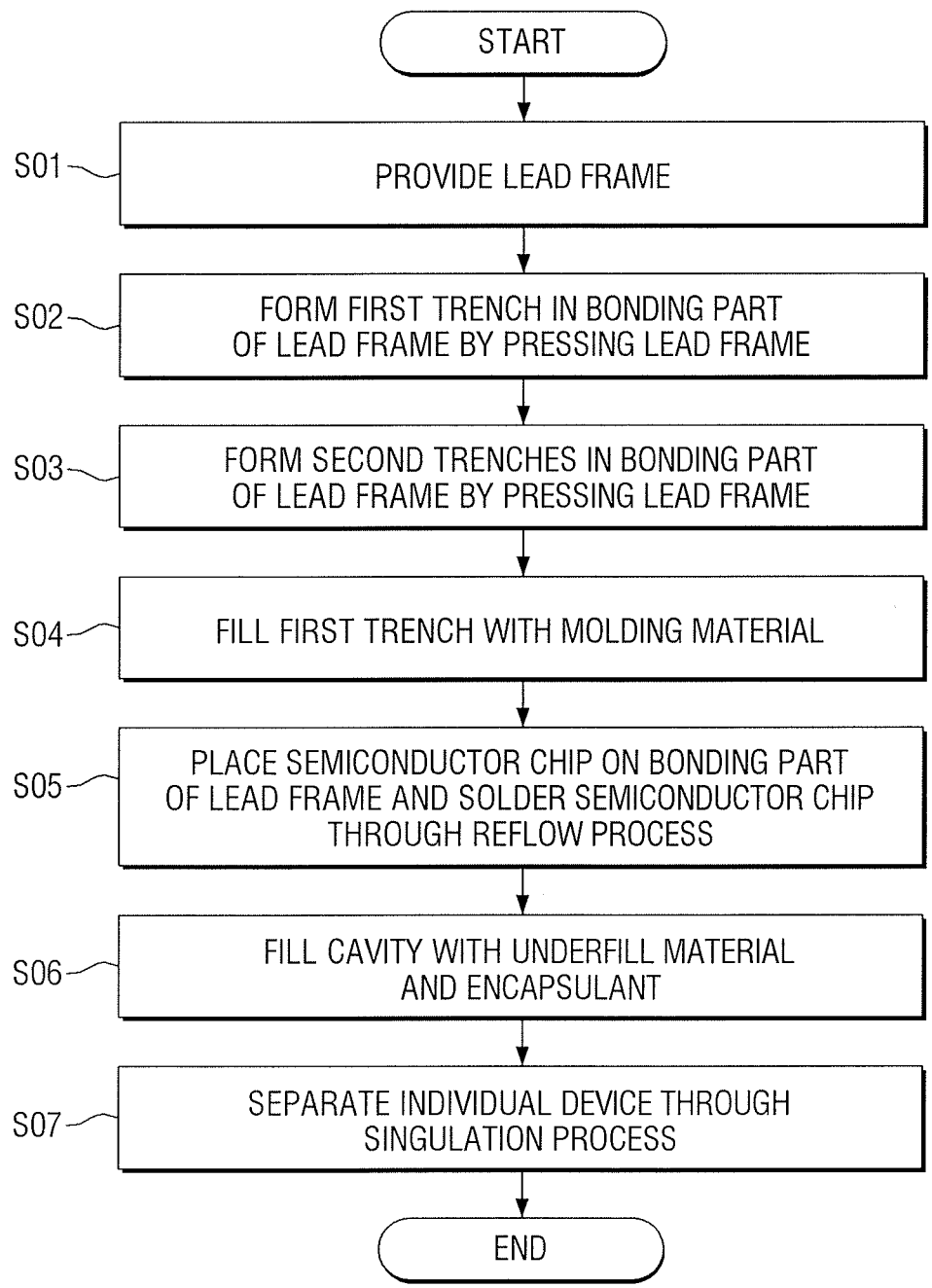
FIG. 7 illustrates a flowchart of a method of manufacturing a semiconductor package, according to an exemplary embodiment of the present disclosure.

FIG. 7 is a flowchart illustrating a method of manufacturing a semiconductor package, according to an exemplary embodiment of the present disclosure.

Referring to FIGS. 1 through 2B and 7, the lead frame 10 is provided (S01), the first trench 50 is formed in the bonding part 15 of the lead frame 10 (S02) by pressing the lead frame 10, the second trenches 60 are formed in the bonding part 15 of the lead frame 10 (S03) by pressing the lead frame 10, the first trench 50 is filled with the molding material 45 (S04), the semiconductor chip 100 is placed on the bonding part 15 of the lead frame 10 and is soldered by a reflow process (S05), the cavity 20 is filled with an underfill material and an encapsulant (S06), and each individual device is separated through a singulation process (S07).

The formation of the first trench 50 in the bonding part 15 of the lead frame 10 and the formation of the second trenches 60 in the bonding part 15 of the lead frame 10, i.e., operations S02 and S03, may be performed by different processes. That is, as described above, the first trench 50 and the second trenches 60 may have different widths and may thus be formed by separate pressing processes. Although not illustrated, the third trenches 90 and the fourth trenches 91 may also be formed by a pressing process during or after the formation of the second trenches 60.

Figure 8:
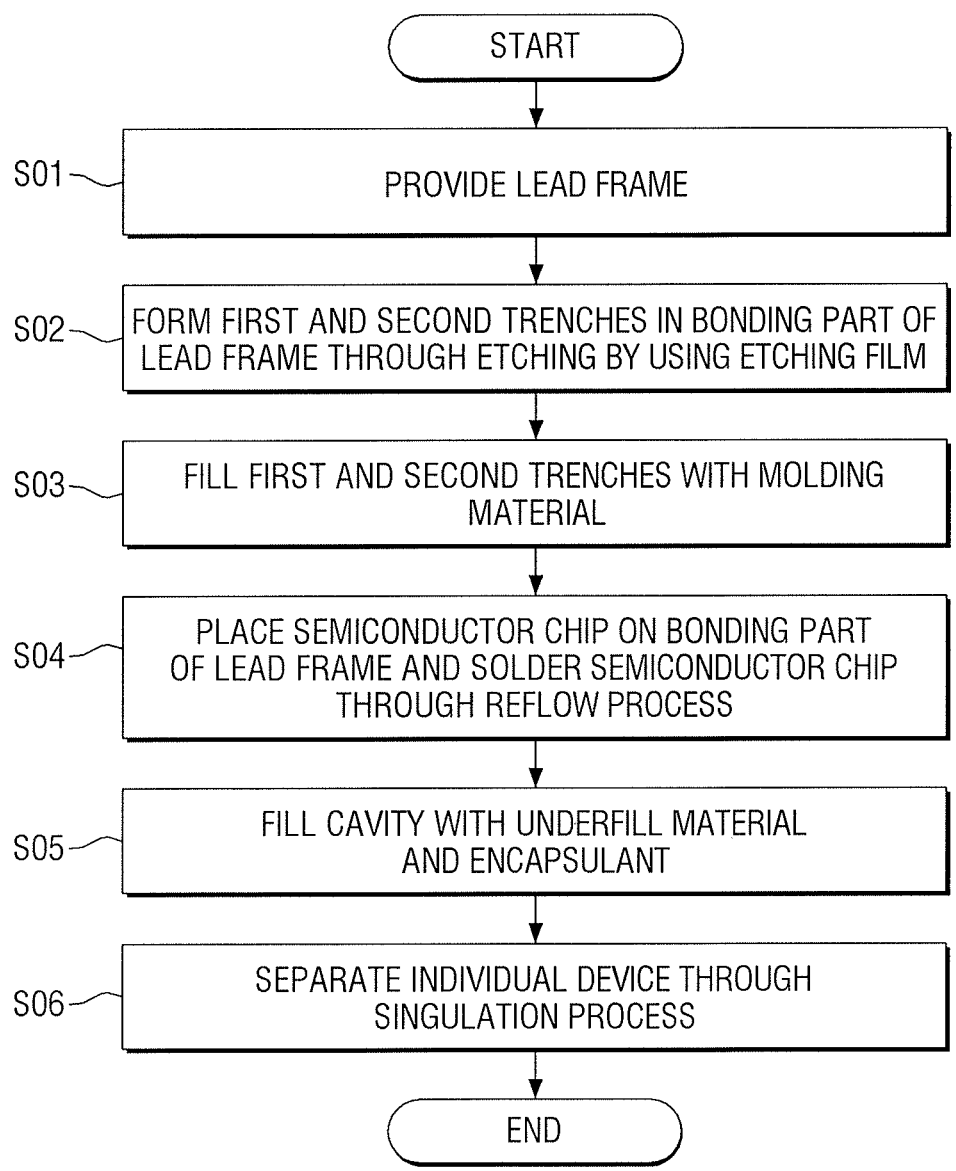
FIG. 8 illustrates a flowchart of a method of manufacturing a semiconductor package, according to another exemplary embodiment of the present disclosure.

FIG. 8 is a flowchart illustrating a method of manufacturing a semiconductor package, according to another exemplary embodiment of the present disclosure. The exemplary embodiment of FIG. 8 will hereinafter be described, focusing mainly on differences with the exemplary embodiment of FIG. 7.

Referring to FIGS. 4 through 6 and 8, the first and second trenches 50 and 160 are formed in the bonding part 15 of the lead frame 10 by etching (e.g., by using an etching film (S02)). Then, the first and second trenches 50 and 160 are filled with a molding material (S03). As described above, the first trench 50 and the second trench 160 may be formed at the same level in step S02, e.g., simultaneously via the same process.

The first part 150 of the first trench 50 and the first part 161 of the second trench 160 may be formed, through etching, at the top of the bonding part 15 at the same time, and the second part 151 of the first trench 50 and the second part 162 of the second trench 160 may be formed, through etching, at the bottom of the bonding part 15 at the same time. Thereafter, the first and second trenches 50 and 160 are filled with the same molding material (S03).

Figure 9:
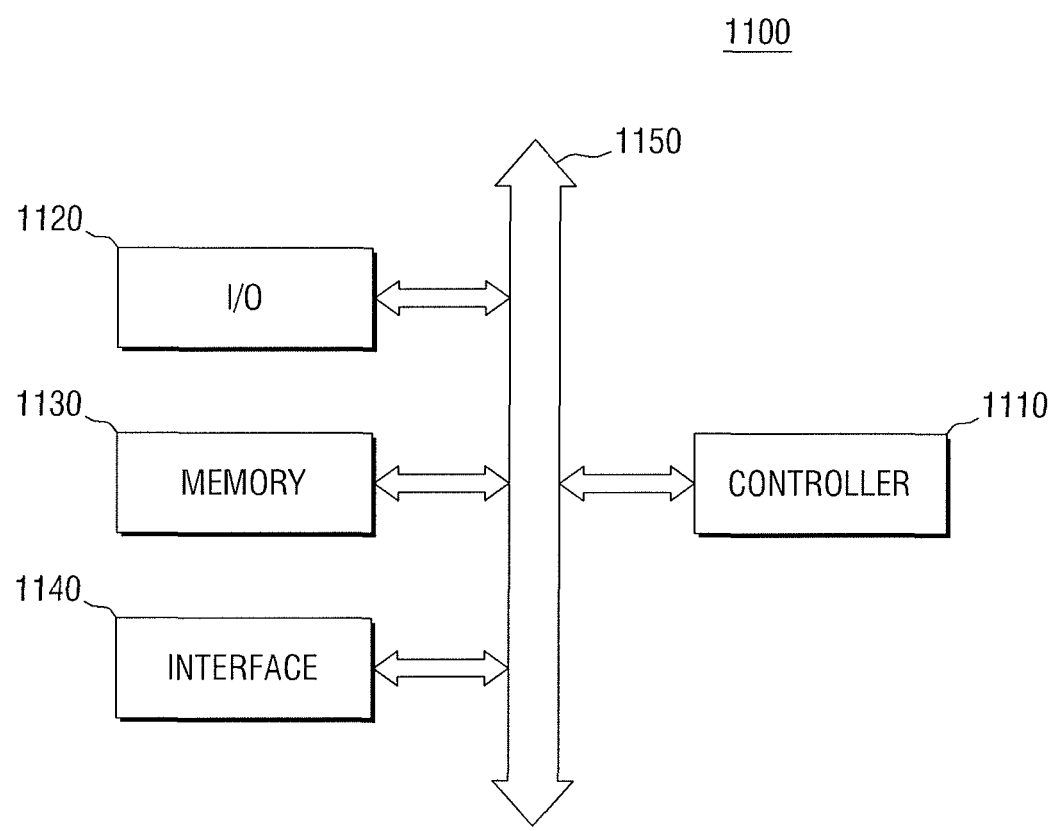
FIG. 9 illustrates a block diagram of an electronic system including a semiconductor package according to some exemplary embodiments of the present disclosure.

FIG. 9 is a block diagram of an electronic system including a semiconductor device according to some exemplary embodiments of the present disclosure.

Referring to FIG. 9, an electronic system 1100 may include a controller 1110, an input/output (I/O) device 1120, a memory device 1130, an interface 1140, and a bus 1150. The controller 1110, the I/O device 1120, the memory device 1130, and/or the interface 1140 may be connected to one another via the bus 1150. The bus 1150 may be a path via which data is transmitted.

The controller 1110 may include at least one of a microprocessor, a digital signal processor, a microcontroller, and a logic element performing similar functions to a microprocessor, a digital signal processor, or a microcontroller. Examples of the I/O device 1120 may include a keypad, a keyboard, and a display device. The memory device 1130 may store data and/or commands. The interface 1140 transmits data to or receives data from a communication network. The interface 1140 may be a wired or wireless interface. Examples of the interface 1140 may include an antenna and a wired or wireless transceiver.

The electronic system 1100 may also include an operating memory for improving the operation of the controller 1110, e.g., a high-speed dynamic random access memory (DRAM) and/or static random access memory (SRAM). A semiconductor device including a semiconductor package according to an exemplary embodiment of the present disclosure may be employed as an operating memory of the electronic system 1100. The semiconductor device may be provided in the memory device 1130 or may be provided as part of the controller 1110 or the I/O device 1120. The electronic system 1110 may be applicable to a Personal Digital Assistant (PDA), a portable computer, a web tablet, a wireless phone, a mobile phone, a digital music player, a memory card, or any type of electronic product capable of transmitting and/or receiving information in a wireless environment.

By way of summation and review, in a reflow process that follows the bonding of a semiconductor chip to a substrate, molten solder from solder bumps may be unevenly spread, thereby causing the semiconductor chip to tilt. As a result, the reliability of the semiconductor chip may be lowered.

In contrast, according to exemplary embodiments, a substrate (i.e., a lead frame) supporting a semiconductor chip includes trenches formed therein to prevent the movement of solder on the substrate. Thus, tilting of the semiconductor chip due to solder flow may be prevented or substantially minimized. Exemplary embodiments of the present disclosure also provide a semiconductor package including the lead frame.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A lead frame, comprising:
a bonding part to bond to a semiconductor chip;
a first trench in the bonding part along a first central axis, the first central axis dividing the bonding part into two parts; and
second trenches in the bonding part along a second central axis, the second central axis dividing the bonding part into two parts, and the first and second central axes vertically intersecting each other.
2. The lead frame as claimed in claim 1, wherein the second trenches are spaced apart from the first trench.
3. The lead frame as claimed in claim 2, wherein the second trenches are two second trenches on opposite sides of the first trench, the two second trenches being spaced from the first trench by a same distance.
4. The lead frame as claimed in claim 2, wherein a width of each of the second trenches is smaller than a width of the first trench.
5. The lead frame as claimed in claim 2, further comprising third trenches in the bonding part and spaced apart from the second trenches, respectively, the third trenches extending in a direction oriented toward an outer edge of the bonding part.
6. The lead frame as claimed in claim 5, wherein the third trenches are parallel to the first trench.
7. The lead frame as claimed in claim 1, wherein the second trenches are connected to the first trench.
8. The lead frame as claimed in claim 7, wherein the second trenches have a same depth as the first trench.
9. The lead frame as claimed in claim 7, further comprising a molding material filling the first trench and the second trenches.
10. The lead frame as claimed in claim 7, wherein the first trench and the second trenches have a same depth, the first and second trenches being in contact with each other.
11. The lead frame as claimed in claim 1, further comprising a reflector surrounding the bonding part and including sidewalls having a predetermined slope.
12. A semiconductor package, comprising:
a lead frame; and
a semiconductor chip bonded to the lead frame, the lead frame including:
a bonding part to bond to the semiconductor chip,
a first trench in the bonding part along a first central axis, the first central axis dividing the bonding part into two parts, and
second trenches in the bonding part along a second central axis, the second central axis dividing the bonding part into two parts, and the first and second central axes vertically intersecting each other.

13. The semiconductor package as claimed in claim 12, further comprising solder bumps electrically connecting the semiconductor chip and the lead frame, the solder bumps having a non-overlapping relationship with the second trenches.

14. The semiconductor package as claimed in claim 13, further comprising an underfill material filling a space defined by inner sides of the solder bumps, a bottom surface of the semiconductor chip, and a top surface of the lead frame.

15. The semiconductor package as claimed in claim 13, wherein the solder bumps are spaced apart from sidewalls of each of the second trenches.

16. The semiconductor package as claimed in claim 13, wherein each of the first and second trenches is positioned between two solder bumps.

17. The semiconductor package as claimed in claim 13, wherein at least one of the first and second trenches is filled with a material different from a material of the lead frame.

18. A lead frame, comprising:

a bonding part to support a semiconductor chip;

a first trench in the bonding part along a first central axis of the bonding part, the first central axis dividing the bonding part into two parts, and the first trench being filled with a material different from a material of the lead frame; and second trenches in the bonding part along a second central axis, the second central axis dividing the bonding part into two parts, and the first and second central axes being perpendicular to each other.

19. The lead frame as claimed in claim 18, wherein the first trench is filled with an insulating material, a top surface of the insulating material being level with a stop surface of the bonding part.

20. The lead frame as claimed in claim 18, wherein the first trench extends through an entire thickness of the bonding part.

* * * * *